US008872144B1

(12) United States Patent
Fomenkov

(10) Patent No.: US 8,872,144 B1
(45) Date of Patent: Oct. 28, 2014

(54) SYSTEM AND METHOD FOR LASER BEAM FOCUS CONTROL FOR EXTREME ULTRAVIOLET LASER PRODUCED PLASMA SOURCE

(71) Applicant: Cymer, LLC, San Diego, CA (US)

(72) Inventor: Igor V. Fomenkov, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/035,847

(22) Filed: Sep. 24, 2013

(51) Int. Cl.
*H01J 37/00* (2006.01)
*H01J 37/15* (2006.01)
*H01J 37/21* (2006.01)
*H01J 35/20* (2006.01)
*H05G 2/00* (2006.01)

(52) U.S. Cl.
CPC .................................... *H05G 2/008* (2013.01)
USPC .................................... 250/504 R; 250/493.1

(58) Field of Classification Search
USPC ........................ 250/372, 461.1, 493.1, 504 R
See application file for complete search history.

(56) References Cited

U.S. PATENT DOCUMENTS

| | | | | |
|---|---|---|---|---|
| 7,164,144 | B2 * | 1/2007 | Partlo et al. | 250/504 R |
| 7,388,220 | B2 * | 6/2008 | Fomenkov et al. | 250/504 R |
| 7,411,203 | B2 * | 8/2008 | Fomenkov et al. | 250/504 R |
| 7,449,704 | B2 * | 11/2008 | Fomenkov et al. | 250/504 R |
| 7,482,609 | B2 * | 1/2009 | Ershov et al. | 250/504 R |
| 8,242,472 | B2 * | 8/2012 | Moriya et al. | 250/504 R |
| 8,395,133 | B2 * | 3/2013 | Moriya et al. | 250/504 R |
| 8,399,870 | B2 * | 3/2013 | Moriya et al. | 250/504 R |
| 8,698,114 | B2 * | 4/2014 | Moriya et al. | 250/504 R |
| 2005/0205810 | A1 * | 9/2005 | Akins et al. | 250/504 R |
| 2012/0019826 | A1 * | 1/2012 | Graham et al. | 356/400 |
| 2012/0319014 | A1 * | 12/2012 | Moriya et al. | 250/504 R |

FOREIGN PATENT DOCUMENTS

WO WO 2012/046133 * 4/2012

OTHER PUBLICATIONS

U.S. Appl. No. 14/184,777, titled "Beam Position Control For An Extreme Ultraviolet Light Source", submitted Feb. 20, 2014.*
U.S. Appl. No. 61/787,228, filed Mar. 15, 2013 and titled Beam Position Control For An Extreme Ultraviolet Light Source.*

* cited by examiner

*Primary Examiner* — Bernard E Souw
(74) *Attorney, Agent, or Firm* — Gard & Kaslow LLP

(57) ABSTRACT

Focus of a laser beam on a target in a Laser Produced Plasma (LPP) Extreme Ultraviolet (EUV) light source is maintained by focusing reflected light from the target illuminated by a laser source, sampling the focused reflected light in a plurality of planes at different optical path lengths, and comparing the image sizes of the focused reflected light at the plurality of planes to determine a correction signal to correct the focus of the laser source. In an embodiment, the focused reflected light is split into a two optical paths of differing optical path lengths, with each optical path directed to a sensing device at an imaging plane. Since each of the optical paths is of a different length, the images of the target taken by the sensing device at the imaging plane will be of different sizes. By comparing the relative sizes of the target images from the optical paths, a correction signal is produced to correct the focus of the laser source.

13 Claims, 4 Drawing Sheets

SYSTEM AND METHOD FOR LASER BEAM FOCUS CONTROL FOR EXTREME ULTRAVIOLET LASER PRODUCED PLASMA SOURCE

BACKGROUND OF THE INVENTION

1. Field of the Invention

The present invention relates generally to laser technology for photolithography, and, more particularly, to optimization of extreme ultraviolet (EUV) light production.

2. Description of the Prior Art

The semiconductor industry continues to develop lithographic technologies which are able to print ever-smaller integrated circuit dimensions. Extreme ultraviolet (EUV) light (also sometimes referred to as soft x-rays) is generally defined to be electromagnetic radiation having wavelengths of between 10 and 110 nanometers (nm). EUV lithography is generally considered to include EUV light at wavelengths in the range of 10-14 nm, and is used to produce extremely small features (e.g., sub-32 nm features) in substrates such as silicon wafers. These systems must be highly reliable and provide cost-effective throughput and reasonable process latitude.

Methods to produce EUV light include, but are not necessarily limited to, converting a material into a plasma state that has one or more elements (e.g., xenon, lithium, tin, indium, antimony, tellurium, aluminum, etc.) with one or more emission line(s) in the EUV range. In one such method, often termed laser-produced plasma (LPP), the required plasma can be produced by irradiating a target, such as a droplet, stream or cluster of material having the desired spectral line-emitting element, with a laser beam at an irradiation site.

The spectral line-emitting element may be in pure form or alloy form (e.g., an alloy that is a liquid at desired temperatures), or may be mixed or dispersed with another material such as a liquid, This target is delivered to a desired irradiation site (e.g., a primary focal spot) and illuminated by a laser source within an LPP EUV source plasma chamber for plasma initiation and the generation of EUV light. It is necessary for the laser beam, such as from a high power $CO_2$ laser source, to be focused on a position through which the target will pass and timed so as to intersect the target material when it passes through that position in order to hit the target properly to obtain a good plasma, and thus, good EUV light.

Infrared metrology is used with the EUV source to view the process of generating EUV light, for example, viewing and measuring the light reflected from the target as the target is illuminated by the laser source. Such measurements are referred to as Return Beam Diagnostics (RBD). These return beam diagnostics may include measurements of target position and shape, effectiveness of laser source illumination, laser source focus, and the like.

This metrology may be applied to a high-power laser source, or to a second laser source such as a pre-pulse laser source which illuminates the target prior to the target being illuminated by the high-power laser source.

The focus of the laser source on the target is critical to EUV production. This focus on the target changes during the operation of the EUV source, such as through thermal heating of the optics used to focus the laser source on the target, thermal expansion of other components in the EUV source affecting target focus, and the like.

What is needed, therefore, is a way to correct the focus of the laser source the target in a LPP EUV system.

SUMMARY

In an embodiment is presented a system for laser beam focus control in a laser produced plasma extreme ultraviolet light source, comprising: a focusing element configured to receive light reflected from a target when the target is illuminated by a laser source, the focusing element focusing the received reflected light along an optical path, a beam splitter located on the optical path configured to receive the focused reflected light and to split the focused reflected light into a first split beam and a second split beam, a sensing device configured to receive the first split beam from the beam splitter at a first sensing location on the sensing device, a reflecting element configured to receive the second split beam from the beam splitter and to direct the second split beam to a second sensing location on the sensing device, and a controller coupled to the sensing device, the controller configured to: determine an image size of the first split beam at the first sensing location on the sensing device, determine an image size of the second split beam at the second sensing location on the sensing device, generate a focus correction signal indicating a front focus condition when the image size of the first split beam at the first sensing location on the sensing device is smaller than the image size of the second split beam at the second sensing location on the sensing device, generate a focus correction signal indicating a back focus condition when the image size of the first split beam at the first sensing location on the sensing device is larger than the image size of the second split beam at the second sensing location on the sensing device, and provide the generated focus correction signal to a laser focus controller.

In an embodiment is presented a method for laser beam focus control in a laser produced plasma extreme ultraviolet light source, the method comprising: receiving, by a focusing element, a reflected light from a target illuminated by a laser source; focusing, by the focusing element, the received reflected light along an optical path; determining, by a first sensing device, an image size of the focused reflected light at a first optical path length from the focusing element; determining, by a second sensing device an image size of the focused reflected light at a second optical path length from the focusing element, wherein the second optical path length is longer than the first optical path length; generating, by a controller, a focus correction signal indicating a front focus condition when the image size of the focused reflected light at the first optical path length from the focusing element is smaller than the image size of the focused reflected light at the second optical path length from the focusing element, generating, by a controller, a focus correction signal indicating a back focus condition when the image size of the focused reflected light at the first optical path length from the focusing element is larger than the image size of the focused reflected light at the second optical path length from the focusing element, and coupling the generated focus correction signal between the controller and a laser focus controller.

The method for laser beam focus control in a laser produced plasma extreme ultraviolet light source where the first and second optical path lengths are formed by: splitting the focused reflected light by a beam splitter configured on the optical path from the focusing element into first and second split beams, directing the first split beam to the first sensing device, forming the first optical path length, and directing the second split beam to a reflecting element, the reflecting element further directing the second split beam to the second sensing device, forming the second optical path length.

DETAILED DESCRIPTION OF THE INVENTION

In the present approach, focus of a laser source on a target in a Laser Produced Plasma (LPP) Extreme Ultraviolet (EUV) light source is determined by a return beam diagnostics (RBD) module by focusing reflected light from the target illuminated by the laser source, determining target image sizes of the focused reflected light at different optical path lengths, and comparing the target image sizes at the different optical path lengths to generate a correction signal to correct the focus of the laser source on the target.

In an embodiment, the focused reflected light is split into two optical paths of differing optical path lengths, a shorter first optical path, and a longer second optical path, with each optical path directed to different imaging areas of a common sensing device. The target image sizes are determined by the sensing device at the two different optical path lengths. Since the optical path lengths to the sensing device are different, the target image sizes determined by the sensing device will be different. By comparing the target image sizes from the two optical path lengths, a correction signal is generated to correct the focus of the laser source. As an example, a focus correction signal indicating a front focus condition is generated when the target image size on the shorter optical path is smaller than the target image size on the longer optical path. Conversely, a focus correction signal indicating a back focus condition is generated when the target image size on the shorter optical path is larger than the target image size on the longer optical path.

Figure 1:
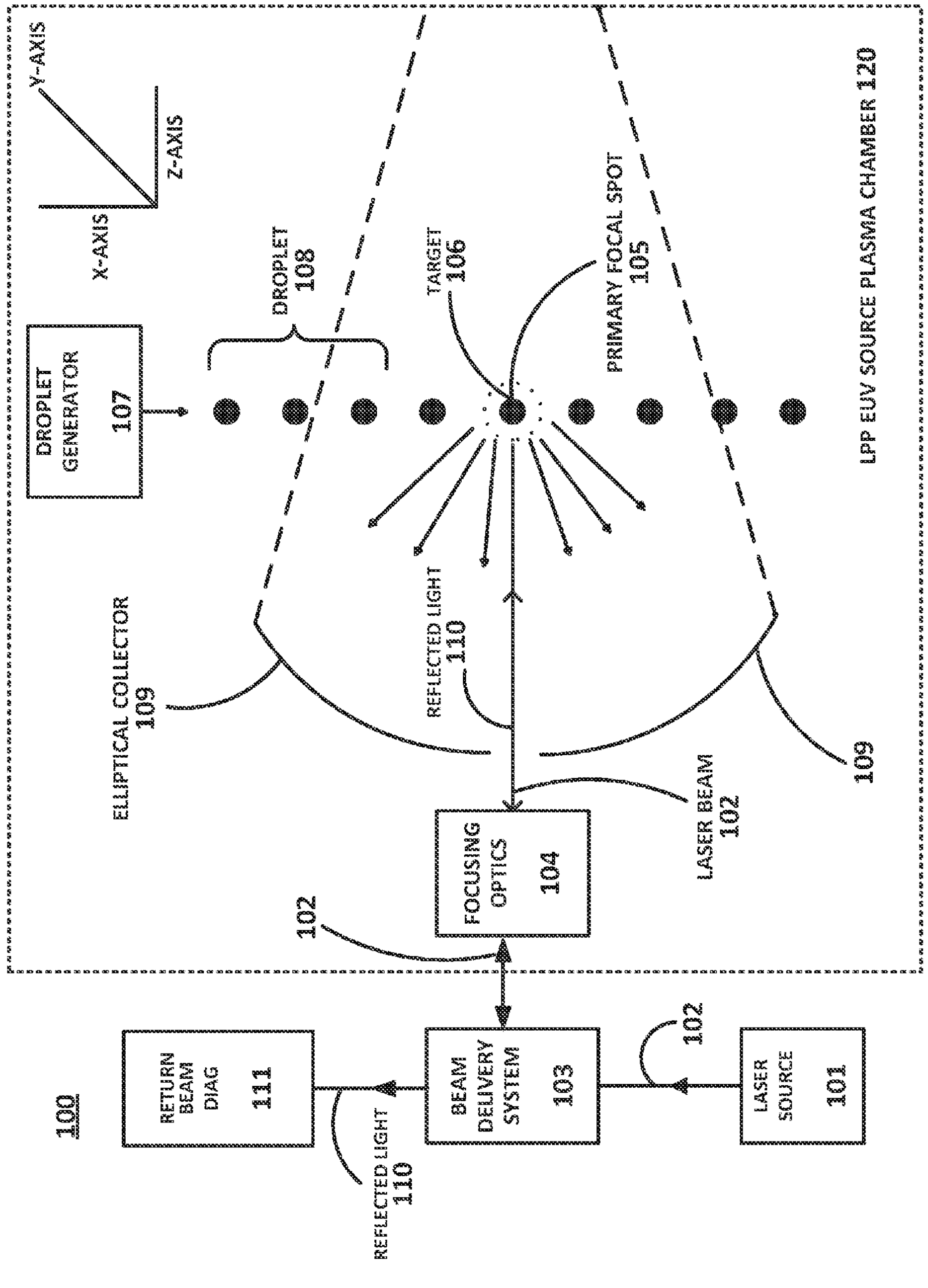
FIG. 1 is a schematic illustrating some of the components of a typical LPP EUV system in which the present approach may be used.

FIG. 1 illustrates some of the components of a typical LPP EUV system 100 in which the present approach may be used. A laser source 101, such as a high power CO, laser, produces a laser beam 102 that passes through a beam delivery system 103 and through focusing optics 104. Focusing optics 104 have a primary focal spot 105 at an irradiation site within an LPP EUV source plasma chamber 120, irradiating a target 106. A droplet generator 107 produces and ejects target droplets 108 of an appropriate target material. When irradiated by laser beam 102 at the irradiation site, target 106 produces plasma that emits EUV light. An elliptical collector 109 focuses the EUV light from the plasma for delivering the produced EUV light to, e.g., a lithography system, not shown. In some embodiments, there may be multiple laser sources 101, with beams that all converge on focusing optics 104. One type of LPP EUV light source may use a $CO_2$ laser and a zinc selenide (ZnSe) lens with an anti-reflective coating and a clear aperture of about 6 to 8 inches.

To measure the EUV generation process, a reflected light 110 from target 106 is directed to return beam diagnostics (RBD) module 111, shown in more detail in FIGS. 2 and 3. In one embodiment, as shown in FIG. 1, reflected light 110 passes through focusing optics 104. Reflected light 110 is directed to RBD module 111; reflected light 110 may pass through beam delivery system 103, or may be directed separately from beam delivery system 103 such as through the use of mirrors, beam splitters, or other techniques known in the art.

Figure 2A:
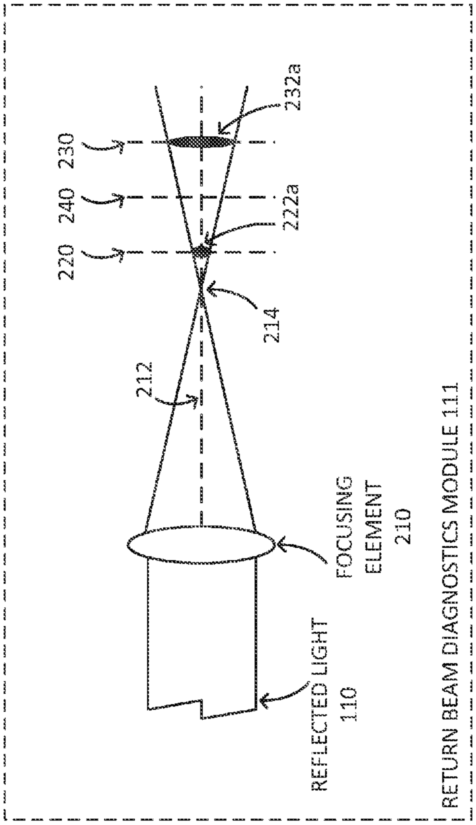
FIG. 2A is a diagram illustrating the principles of a return beam diagnostics focus correction system in a front focus condition.

Turning now to FIG. 2A, the principles of a return beam diagnostics focus correction system according to the present approach are shown. Reflected light 110 is received by focusing element 210 from target 106 in LPP EUV source plasma chamber 120.

As shown, focusing element 210 directs the reflected light 110 along an optical path 212. Additionally, focusing element 210 focuses the reflected light 110 at an RBD focal point 214 on optical path 212. Because of this focusing action and as would be understood by one of skill in the art, the image size of target 106 created by reflected light 110 is at a minimum at RBD focal point 214 but is larger at locations away from RBD focal point 214, such as at sensing planes 220 and 230 also shown located along optical path 212.

It is important to note that the location of RBD focal point 214 along optical path 212 is determined by the characteristics of the overall system which begins with target 106 of FIG. 1 and extends through LPP EUV source chamber 120 to RBD diagnostics module 111 and focusing element 210. As previously explained, focus on target 106 changes during the operation of the EUV source. Such changes in the focus on target 106 result in a change in the location of RBD focal point 214 along optical path 212.

Thus when the location of RBD focal point 214 changes due to changes in the focus on target 106, the location of RBD focal point 214 with respect to sensing planes 220 and 230 also changes.

As understood by one of skill in the art, the size of the target image determined at a point along optical path 212 depends on the distance of the point from RBD focal point 214. Therefore as the distance between a point along optical path 212 and RBD focal point 214 changes, the size of the target image determined at that point changes. The greater the distance, the larger the target image. Conversely, the smaller the distance, the smaller the target image.

This means that the size of the target images determined at sensing planes 220 and 230 depends on the distances from those sensing planes to RBD focal point 214. As the location of RBD focal point 214 along optical path 212 changes during the operation of the EUV source, the distances between RBD focal point 214 and sensing planes 220 and 230 change, and the sizes of the target images determined at sensing planes 220 and 230 change. The sensing plane which is closest to RBD focal point 214 will have the smaller target image size, while the sensing plane which is farthest from RBD focal point 214 will have the larger target image size.

RBD focal point 214 on optical path 212 is shown between focusing element 210 and sensing plane 220. As shown in this example, because the size of the target image increases away from RBD focal point 214, the size of target image **222*a* determined at sensing plane 220 will be smaller than the size of target image 232*a* determined at sensing plane 230**.

This condition, in which the size of target image **222*a* is smaller than the size of target image 232*a*, holds as long as RBD focal point 214 is located between focusing element 210 and a plane 240 along optical path 212 located halfway between sensing planes 220 and 230**.

Figure 2B:
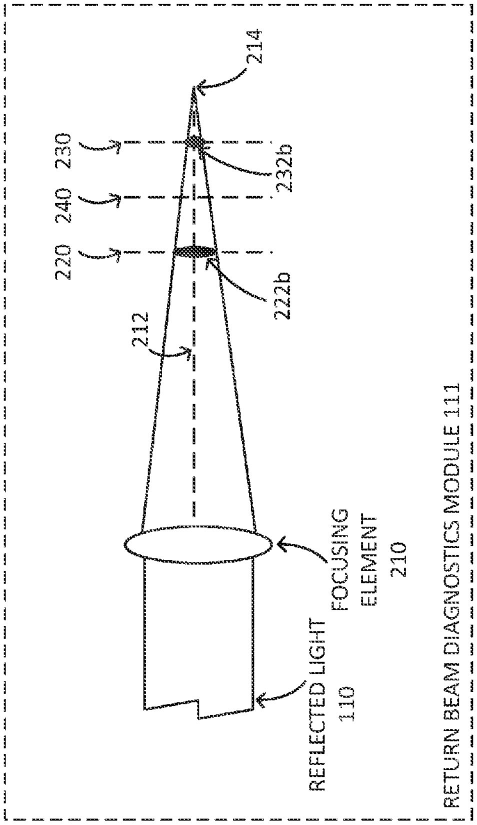
FIG. 2B is a diagram illustrating the principles of a return beam diagnostics focus correction system in a back focus condition.

Plane 240 represents the transition between a front focus condition as shown in FIG. 2A, and a back focus condition as shown in FIG. 2B. When RBD focal point 214 on optical path 212 is located at plane 240, halfway between sensing planes 220 and 230, indicating an in-focus condition, the target image at sensing plane 220 is the same size as the target image at sensing plane 230, as the distances between RBD focal point 214 and sensing planes 220 and 230 are the same.

As shown in FIG. 2B, again due to changes in the focus on target 106, RBD focal point 214 is now located on optical path 212 past plane 230. In this example, a target image 222*b* at sensing plane 220, is larger than a target image 232*b* at sensing plane 230, because sensing plane 220 is now farther from RBD focal point 214 than is sensing plane 230.

This condition, that the size of target image 222*b* is larger than the size of target image 232*b*, holds as long as RBD focal point 214 is on optical path 212 past plane 240, because sensing plane 220 is now farther from RBD focal point 214 than is sensing plane 230.

As described elsewhere herein, conditions in LPP EUV source plasma chamber 120 of FIG. 1 change, thus changing the focus on target 106. This causes the location of RBD focal point 214 to also change. As an example, if the focus on target 106 moves away from elliptical collector 109, RBD focal point 214 of FIG. 2 moves closer to focusing element 210. Conversely, if the focus on target 106 moves closer to elliptical collector 109, RBD focal point 214 moves away from focusing element 210. Note that the coupling of these movements, that is, the direction of movement of focal point 214 in relation to the direction of movement of the focus on target 106, is determined by the particular optical embodiment, and may be reversed from the example given.

Figure 3A:
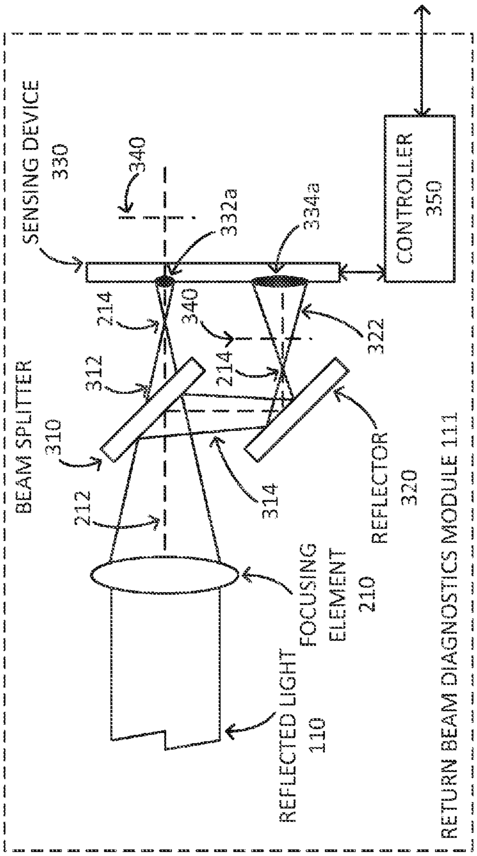
FIG. 3A is a diagram of a return beam diagnostics focus correction system in a front focus condition according to an embodiment.

FIG. 3A is a diagram of a return beam diagnostics focus correction system using the principles shown in FIGS. 2A and 2B and explained herein, according to an embodiment. As shown, by focusing and splitting the reflected light into two beams, one beam directed to a sensing device, and the other beam directed to a reflector and the sensing device, two optical paths of different lengths are provided. A controller coupled to the sensing device determines the target image sizes of the two beams. A comparison of the target image sizes of these two beams determines a focus condition for correcting the focus on target 106 of FIG. 1.

The RBD diagnostics module 111 embodiment of FIG. 3A comprises focusing element 210, a beam splitter 310, a reflector 320, a sensing device 330, and a controller 350.

In an embodiment, focusing element 210 is a lens, beam splitter 310 is a plate or cube beam splitter, reflector 320 is a mirror, sensing device 330 is an image sensor capable of providing an image at the wavelength of the laser source used, and controller 350 is a microprocessor.

As shown, reflected light 110 is focused by focusing element 210 and directed on optical path 212. Focused light on optical path 212 is directed to beam splitter 310. Beam splitter 310 splits the focused light into a first split beam 312 and a second split beam 314. First split beam 312 is directed to sensing device 330, forming a first optical path from beam splitter 310 to sensing device 330. Second split beam 314 is directed to reflector 320. Reflector 320 receives second split beam 314 and reflects it as reflected beam 322 to sensing device 330, forming a second optical path from beam splitter 310 to sensing device 330. It is to be noted that, due to this arrangement, the second optical path is longer than the first optical path.

The first optical path results in a first target image 332 on sensing device 330. The longer second optical path results in a second target image 334 on sensing device 330. Thus two target images from two different optical path lengths are produced on a single sensing device.

In accordance with the principles described with reference to FIG. 2A, target image 332 determined at sensing device 330 along the first optical path corresponds to target image 222 at sensing plane 220 of FIG. 2A, while target image 334 determined at sensing device 330 along the longer second optical path corresponds to target image 232 at sensing plane 230 of FIG, 2A. Plane 340 is the equivalent of plane 240, having locations at the same optical path length on both the first optical path and on the longer second optical path, indicating the transition from the first focus condition to the second focus condition.

FIG. 3A shows a front focus condition similar to that shown in FIG. 2A, with RBD focal point 214 located between focusing element 210 and sensing device 330. In the front focus condition shown, with the length of the first optical path from RBD focal point 214 to sensing device 330 shorter than the length of the second optical path from RBD focal point 214 to sensing device 330, the size of target image 332*a* is smaller than the size of target image 334*a*.

Figure 3B:
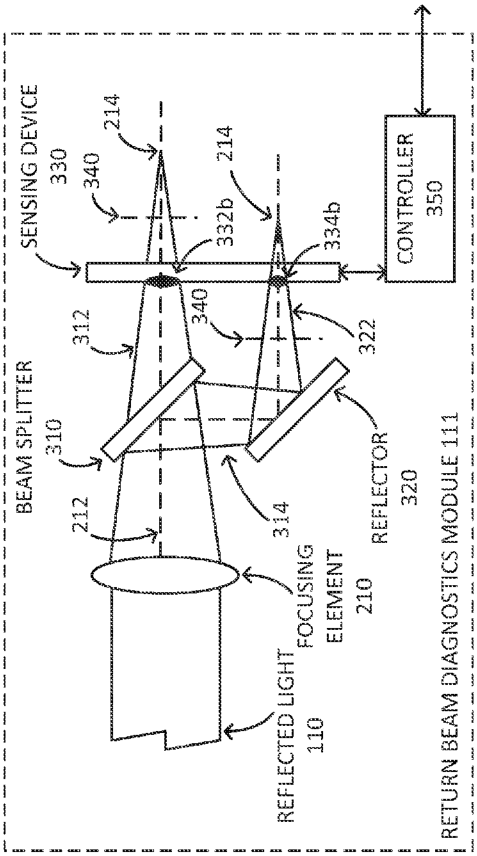
FIG. 3B is a diagram of a return beam diagnostics focus correction system in a back focus condition according to an embodiment.

Conversely, FIG. 3B shows a back focus condition similar to that shown in FIG. 2B, with focal point 214 located past sensing device 330, away from focusing element 210. In this back focus condition, with the optical path length between focal point 214 and sensing device 330 on optical path 312 longer than the optical path length between focal point 214 and sensing device 330 on optical path 322, the size of target image 332*b* is larger than the size of target image 334*b*.

Controller 350 is coupled to sensing device 330. Controller 350 reads sensing device 350 and determines the sizes of target images 332 and 334. Controller 350 compares these target image sizes and generates a focus correction signal based on this comparison. This focus correction signal indicates the direction of the change in focus on target 106 in LPP EUV source plasma chamber 120.

As shown in FIG. 3A, when the size of target image 332*a* is smaller than the size of target image 334*a*, a focus correction signal indicating a front focus condition is generated by controller 350. This focus condition is a front focus condition, because focal point 214 on optical path 212 is in front of plane 340, and corresponds to the front focus condition of FIG. 2A.

Conversely as shown in FIG. 3B, the size of target image 332*b* is larger than the size of target image 334*b*. In this focus condition, controller 350 generates a focus correction signal indicating a back focus condition. This focus condition is a back focus condition, in the opposite direction of the front focus condition, because focal point 214 on optical path 212 is on the opposite side of plane 340 and focusing element 210, and corresponds to the back focus condition of FIG. 2B.

The focus correction signal generated by controller 350 is coupled to a laser focus controller (not shown) in LPP EUV source 100. In an embodiment, the focus correction signal is sent by controller 350 to the laser focus controller. In an alternative embodiment, the focus correction signal is retrieved from controller 350 by the laser focus controller. In an embodiment, this focus control signal is used to correct the focus of focusing optics 104, for example by changing the position of optical elements within focusing optics 104 in one direction when a front focus condition is generated by controller 350, and conversely changing the position of optical elements within focusing optics 104 in an opposite direction when a back focus condition is generated by controller 350.

It is to be understood that other elements may be used in RBD diagnostics module 111. For example, in alternative embodiments, focusing element 210 is a curved mirror, other types of beam splitters may be used for beam splitter 310, and reflector 320 is a beam splitter.

In an embodiment, sensing device 330 is an image sensor capable of providing an image at the wavelength of the laser source used. An image sensor such as charge coupled device (CCD) or a metal oxide semiconductor (MOS) image sensor may be used for some wavelengths. For other wavelengths, an image sensor with sensitivity in the infrared region such as a pyrocam or microbolmeter array may be used. In an embodiment, controller 350 may be a microprocessor executing computer software to retrieve data from sensing device 330 and perform the functions described herein. In an alternative embodiment, such functions may be performed by a microprocessor contained in LPP EUV source 100.

Figure 4:
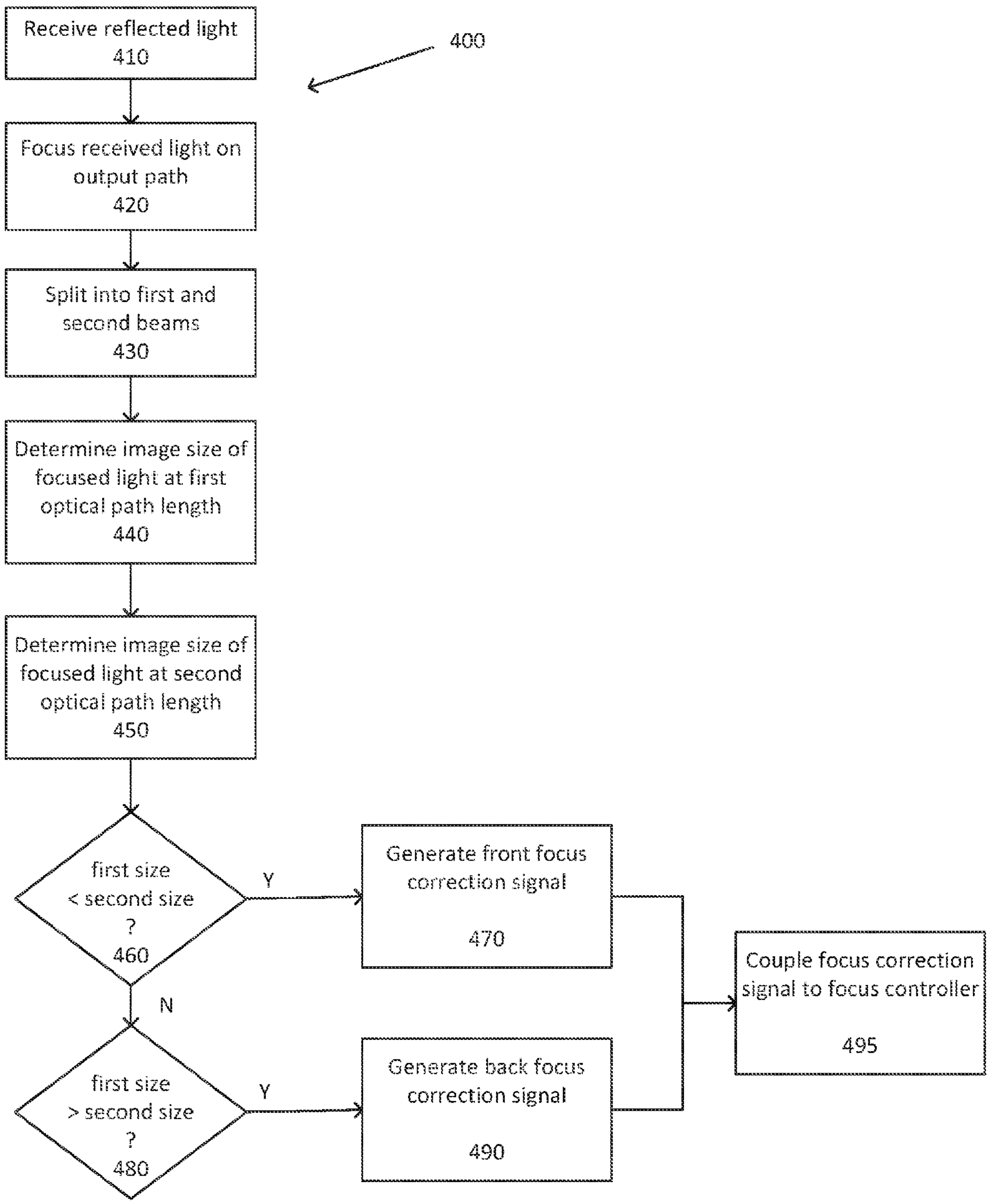
FIG. 4 is a return beam diagnostics focus correction method according to an embodiment.

An embodiment of a method according to the present approach is shown in the flowchart of FIG. 4.

In step 410, reflected light from a target illuminated by a laser source is received at a focusing element. In an embodiment such as that shown in FIG. 3A, reflected light 110 is received at focusing element 210.

In step 420, the received reflected light is focused on an output path. In an embodiment, reflected light 110 is focused by focusing element 210 on output path 212.

In step 430, the focused reflected light is split into a first and a second beam. In an embodiment, focused light on path 212 is split by beam splitter 310 into a first split beam 312 and a second split beam 314.

In step 440, a first image size of the focused light is determined on a first optical path from the focusing element. In an embodiment, the first split beam 312 is directed to a sensing device 330 to determine the size 332 of the focused light on the first optical path.

In step 450, a second image size of the focused light is determined on a second optical path from the focusing element. In an embodiment, the second split beam 314 from the beam splitter 312 is directed to a reflecting element 320. The resulting reflected second split beam 322 is directed to the sensing device 330, forming a second optical path which is longer than the first optical path. The reflected second split beam 322 is directed to the sensing device 330 to determine the size 334 of the focused light at the second optical path.

In step 460, a determination is made if the first image size is smaller than the second image size, indicating a front focus condition. In an embodiment, controller 350 compares first image size 332 with second image size 334. If first image size 332 is smaller than second image size 334, a front focus condition is determined.

In step 470, because a front focus condition has been determined in step 450, a focus correction signal is generated indicating a front focus condition. In an embodiment, controller 350 generates a focus correction signal indicating a front focus condition.

Alternately, if in step 460 it was determined that the first image size is not smaller than the second image size, then the method continues with step 480.

In step 480, a determination is made if the first image size is larger than the second image size, indicating a back focus condition. In an embodiment, controller 350 compares first image size 332 with second image size 334. If first image size 332 is larger than second image size 334, a back focus condition is determined.

In step 490, because a back focus condition has been determined in step 480, a focus correction signal is generated indicating a focus condition in a back direction. In an embodiment, controller 350 generates a focus correction signal indicating a back focus condition.

In step 495, the determined focus correction signal is coupled to a focus controller. In an embodiment, the focus correction signal generated by the controller 350 is coupled to a laser focus controller (not shown) in LPP EUV source 100. In an embodiment, the focus correction signal is sent by the controller to the laser focus controller. In another embodiment, the laser focus control retrieves the focus correction signal from the controller.

It should be noted that the method and apparatus disclosed herein can be expanded to make more than two target image measurements along more than two optical paths, for example by using a beam splitter for reflector 320 of FIG. 3A, and adding an additional reflector in the same manner as reflector 320, providing a third optical path between focusing element 210 and sensing element 330.

In an alternative embodiment where a beam splitter is used for reflector 320, a portion of beam 314 may be provided for additional measurements, such as target position, target intensity, optical power, or other return beam diagnostic measurements. In such an embodiment, an optical power sensor such as an optical power meter or a photoelectromagnetic (PEM) detector may be configured to receive the additional split beam produced by a beam splitter used for reflector 320.

The disclosed method and apparatus have been explained herein with reference to several embodiments. Other embodiments will be apparent to those skilled in the art in light of this disclosure. Certain aspects of the described method and apparatus may readily be implemented using configurations other than those described.

Additionally, different algorithms and/or logic circuits, perhaps more complex than those described herein, may be used, as well as possibly different types of laser sources, optical paths, and/or focus lenses.

Further, it should also be appreciated that the described method and apparatus can be implemented in numerous ways, including as a process, an apparatus, or a system. The methods described herein may be implemented by program instructions for instructing a processor such as controller 350 to perform such methods, and such instructions recorded on a nontransitory computer readable storage medium such as a hard disk drive, floppy disk, optical disc such as a compact disc (CD) or digital versatile disc (DVD), flash memory, etc. It should be noted that the order of the steps of the methods described herein may be altered and still be within the scope of the disclosure.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms “comprising,” “including,” and “having,” as used herein, are specifically intended to be read as open-ended terms of art.

What is claimed is:

1. A system for laser beam focus control in a laser produced plasma extreme ultraviolet light source, comprising:

a focusing element configured to receive light reflected from a target when the target is illuminated by a laser source, the focusing element focusing the received reflected light along an optical path, a beam splitter located on the optical path configured to receive the focused reflected light and to split the focused reflected light into a first split beam and a second split beam, a sensing device configured to receive the first split beam from the beam splitter at a first sensing location on the sensing device, a reflecting element configured to receive the second split beam from the beam splitter and to direct the second split beam to a second sensing location on the sensing device, and a controller coupled to the sensing device, the controller configured to:

determine an image size of the first split beam at the first sensing location on the sensing device, determine an image size of the second split beam at the second sensing location on the sensing device, generate a focus correction signal indicating a front focus condition when the image size of the first split beam at the first sensing location on the sensing device is smaller than the image size of the second split beam at the second sensing location on the sensing device, generate a focus correction signal indicating a back focus condition when the image size of the first split beam at the first sensing location on the sensing device is larger than the image size of the second split beam at the second sensing location on the sensing device, and provide the generated focus correction signal to a laser focus controller.

2. The system of claim 1 where the focusing element is a lens.

3. The system of claim 1 where the focusing element is a curved mirror.

4. The system of claim 1 where the reflecting element is a beam splitter.

5. The system of claim 1 where the reflecting element is a mirror.

6. A method for laser beam focus control in a laser produced plasma extreme ultraviolet light source, the method comprising:

(a) receiving, by a focusing element, a reflected light from a target illuminated by a laser source;

(b) focusing, by the focusing element, the received reflected light along an optical path;

(c) determining, by a first sensing device, an image size of the focused reflected light at a first optical path length from the focusing element;

(d) determining, by a second sensing device an image size of the focused reflected light at a second optical path length from the focusing element, wherein the second optical path length is longer than the first optical path length;

(e) generating, by a controller, a focus correction signal indicating a front focus condition when the image size of the focused reflected light at the first optical path length from the focusing element is smaller than the image size of the focused reflected light at the second optical path length from the focusing element, and (f) generating, by a controller, a focus correction signal indicating a back focus condition when the image size of the focused reflected light at the first optical path length from the focusing element is larger than the image size of the focused reflected light at the second optical path length from the focusing element.

7. The method of claim 6 further comprising coupling the generated focus correction signal between the controller and a laser focus controller.

8. The method of claim 6 where the focusing element is a lens.

9. The method of claim 6 where the focusing element is a curved mirror.

10. The method of claim 6 where the first and second optical path lengths are formed by:

splitting the focused reflected light by a beam splitter configured on the optical path from the focusing element into a first split beam and a second split beam, directing the first split beam to the first sensing device, forming the first optical path length, and directing the second split beam to a reflecting element, the reflecting element further directing the second split beam to the second sensing device, forming the second optical path length.

11. The method of claim 10 where the reflecting element is a beam splitter.

12. The method of claim 10 where the reflecting element is a mirror.

13. The method of claim 10 where the first sensing device and the second sensing device are separate sensing locations on a single sensing device.

* * * * *